United States Patent [19]

Rich et al.

[11] Patent Number: 5,030,293
[45] Date of Patent: Jul. 9, 1991

[54] METHOD AND APPARATUS FOR CIRCUIT BOARD CLEANING

[75] Inventors: Randall L. Rich, 2900 E. Parker Rd., Plano, Tex. 75074; Donald F. Renfrow, Richardson, Tex.

[73] Assignee: Randall L. Rich

[21] Appl. No.: 165,904

[22] Filed: Mar. 9, 1988

[51] Int. Cl.⁵ .................... B08B 1/02; B08B 7/00; B08B 3/00
[52] U.S. Cl. ........................... 134/32; 134/33; 134/34
[58] Field of Search ............... 134/32, 33, 34

[56] References Cited

U.S. PATENT DOCUMENTS 3,868,272  2/1975  Tardoskegyi .................... 134/32
4,539,069  9/1985  Fishman et al. .................. 134/32
4,867,800  9/1989  Dishart et al. .................... 134/40
4,895,177  1/1990  Niblett et al. .................... 134/164

Primary Examiner—Curtis R. Davis
Attorney, Agent, or Firm—Richards, Medlock & Andrews

[57] ABSTRACT

A circuit board cleaning apparatus (10) is disclosed which efficiently cleans a circuit board (12). The circuit board is positioned beneath a head assembly (24) whre it is grasped by a number of arms (38) and lowered into the interior of a tank (26). The board is oscillated about a vertical axis within the tank while immersed in a cleaning agent, such as water. Provisions are made to rinse the cleaned board and dry the board. After the board has been cleaned, it is removed from the tank and released. All cleaning, rinsing and drying operations are conducted within the tank.

10 Claims, 8 Drawing Sheets

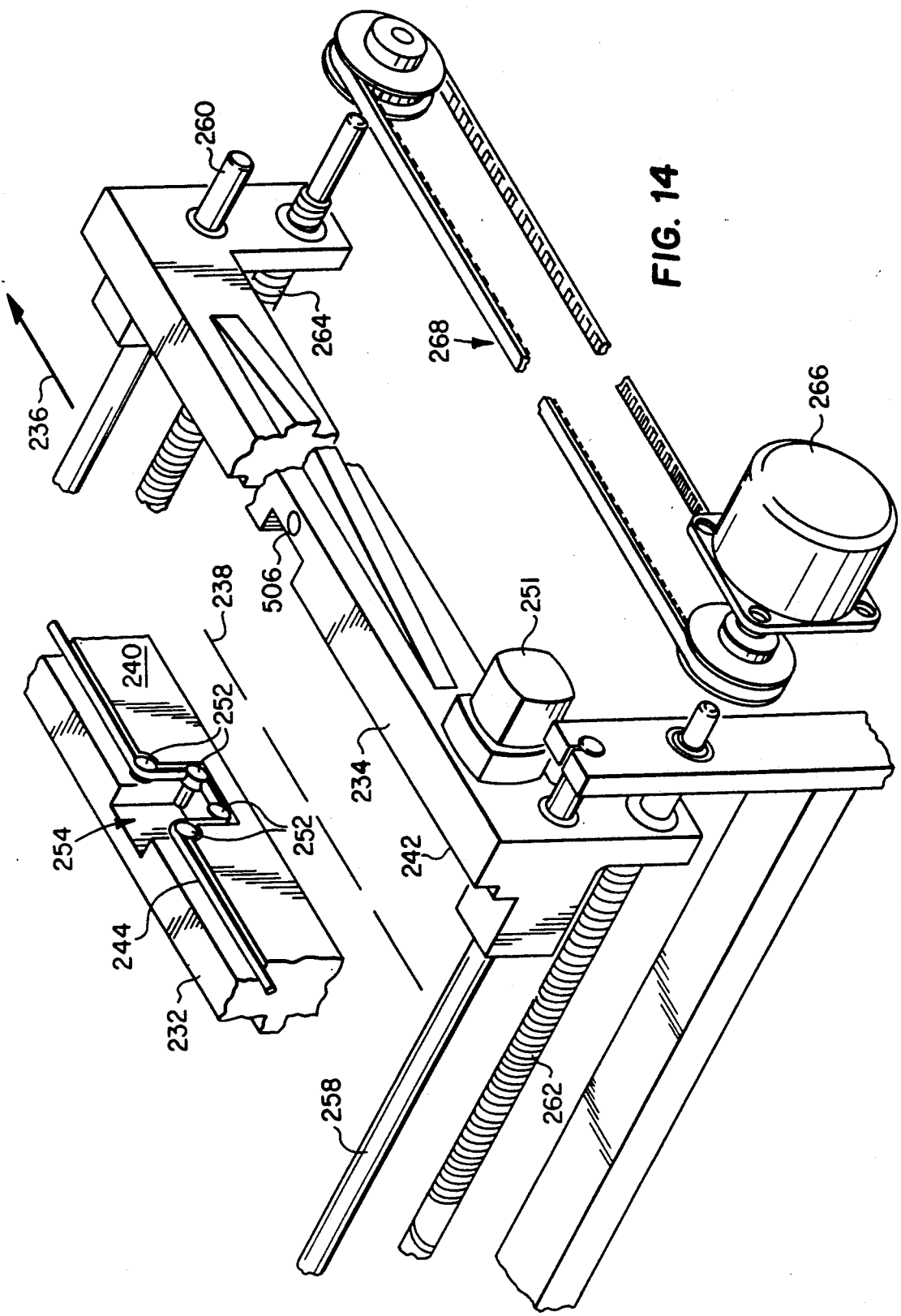

METHOD AND APPARATUS FOR CIRCUIT BOARD CLEANING

TECHNICAL FIELD

This invention relates to the assembly of electronic components, and particularly to the cleaning of circuit boards and hybrids to remove solder flux residue and other contaminants.

BACKGROUND OF THE INVENTION

Virtually all electronic devices manufactured today include one or more circuit boards or related hybrid circuits (hereafter jointly referred to as circuit boards). The individual electronic components are mounted on the circuit board and interconnected by ribbon like electrical conductors on the circuit board itself. Such circuit boards have traditionally used through hole technology wherein the electrical leads from the components extend through the board and are soldered to the board conductors on the lower surface of the board. More recently, surface mount technology has become widely utilized wherein the electrical leads or contacts from the component are soldered directly to the board conductors at the upper surface of the board.

In mounting the individual electronic components on a circuit board, the various leads from the component are soldered to conductors on the circuit board. This soldering process leaves rosin and organic fluxes on the circuit board, potentially giving rise to electronic shorts across the various conductors. Other contaminants which can effect performance include oils, greases, fingerprints and non-specific particulate matter.

To remove the rosin, flux, or other contaminants remaining on the board after soldering, the board is typically washed by running the board through a cleaning machine which sprays a solvent or water on the board to remove the contaminants. The cleaning device commonly has a continuous conveyor belt which conveys the board through the machine past the solvent wash, past a rinsing wash, and finally a drying stage. Apparatus of this type are constructed and sold by Electrovert U.S.A. Corp., of 4330 Beltway Place, Arlington, Texas 76018, which includes their model Century 2000C Water Cleaning System and the system H500 Hydrocleaner. U.S. Pat. No. 3,868,272 relates to the Century 2000C Water Cleaning System. Other suppliers of this type of equipment include: Genesolv/Boron-Blakeslee, 1 Gate Hall Drive, Parsippany, N.J. 07054; Detrex Corp., P. 0. Box 5111, Southfield, Michigan 48086; Corpane Industry, 250 Production Court, Louisville, Kentucky 40299.

These devices use a conveyor belt to guide the circuit boards through various stages of cleaning. Because the electronic components are often mounted so close to the circuit board, often with only a two to four thousandths of an inch gap between the component and the board, the use of water alone has been found insufficient to adequately clean the boards because of the high surface tension of the water. It has thus become necessary to use chlorinated and fluorinated solvents in the initial washing stage to adequately clean the boards. However, these solvents are expensive and hazardous. In fact, the Environmental Protection Agency has established regulations which phase out the use of such solvents beginning in 1993.

A need thus exists for an improved cleaning system which adequately cleans circuit boards while drastically reducing, and possibly even eliminating the use of expensive and toxic solvents. Further, a need exists for a cleaning device which is capable of effectively cleaning between a component and the board when the gap between them is as little to two to four thousandths of an inch.

SUMMARY OF THE INVENTION

In accordance with one aspect of the present invention, an apparatus is provided for cleaning a circuit board which includes structure for exposing the circuit board to a liquid cleaning agent, preferably by immersing the circuit board in the liquid cleaning agent. The apparatus further includes structure for moving the board to induce vigorous relative motion between the liquid cleaning agent and the circuit board to clean the circuit board. Finally, structure is provided for separating the cleaned circuit board and liquid cleaning agent.

In accordance with another aspect of the present invention, the apparatus can include structure for spraying the cleaned circuit board with a rinsing agent and structure for moving the board to induce vigorous relative motion between the circuit and the rinsing agent to rinse the circuit board. Structure is provided for separating the circuit board and rinsing agent and drying the circuit board.

In accordance with another aspect of the present invention, the structure for inducing vigorous relative motion between the circuit board and liquid cleaning agent can comprise structure for grasping the circuit board and oscillating the circuit board about a vertical axis while immersed in the liquid cleaning agent. The cleaning can take place in a enclosed chamber which allows vigorous cleaning action without loss of cleaning agent from the chamber.

In accordance with another aspect of the present invention, the resistivity of the liquid rinsing agent can be monitored subsequent to rinsing the circuit board. If the measured resistivity indicates excessive residue, the apparatus can increase the duration of cleaning of the circuit board within the liquid cleaning agent.

In accordance with yet another aspect of the present invention, the structure for spraying the circuit board with the liquid rinsing agent includes spray nozzles directed on the top and bottom sides of the circuit board to dispense the rinsing agent on to the circuit board.

In accordance with another aspect of the present invention, a mechanism is provided to grasp a circuit board at its edges and move the circuit board into an enclosed chamber where the cleaning, rinsing and drying steps are performed. Another mechanism can orient the circuit board to be cleaned for grasping by the grasping mechanism.

In accordance with another aspect of the present invention, a valve is provided for use with a container for holding a fluid. The container has an interior surface. The valve includes a body mounted to the container with the body having a cylinder formed therein opening through an aperture in the interior surface of the container. The body also has a passage opening into the cylinder a predetermined distance from the aperture in the container. A piston is movable within the cylinder between a valve open position with the passage in fluid communication with the interior of the container and a closed position isolating the passage from the container. In the valve closed position, a portion of the piston forms a continuation of the interior surface of the container across the aperture to prevent fluid from being trapped.

In accordance with another aspect of the present invention a fast discharge pump for rapidly pumping a fluid to a tank and from the tank is provided. The pump includes a cylinder having a first end and a piston. The piston is mounted for slidable sealed movement within the cylinder and defines a pumping chamber between the piston cylinder walls and first end. Structure is provided for pumping fluid in the pump chamber to the tank and for drawing the fluid from the tank back into the pump chamber. A reservoir is provided to supply additional fluid to the pump chamber. A circular valve disc is provided and can be rotated about its center axis to selectively connect the pump chamber to the reservoir or tank.

In accordance with another aspect of the present invention, an apparatus is provided for testing the cleanliness of a circuit board. Structure is provided for spraying a fluid agent on a board while other structure moves the board to induce vigorous relative motion between the board and fluid agent to rinse the board. The fluid agent is collected and its resistivity measured to test the cleanliness of the board.

In accordance with another aspect of the present invention, a method for cleaning a circuit board is provided. The method includes a step of immersing the circuit board within a liquid cleaning agent and inducing vigorous relative motion between the liquid cleaning agent and the circuit board to clean the circuit board. The method further includes a step of separating the cleaned circuit board from the liquid cleaning agent when the board has been cleaned.

BRIEF DESCRIPTION OF THE DRAWINGS

For a more complete understanding of the present invention and for further advantages thereof, reference is now made to the following description of the preferred embodiment taken in conjunction with the accompanying drawings, in which:

FIG. 14 is a perspective view of the conveyor assembly of the circuit board cleaning apparatus;

DETAILED DESCRIPTION

Figure 1:
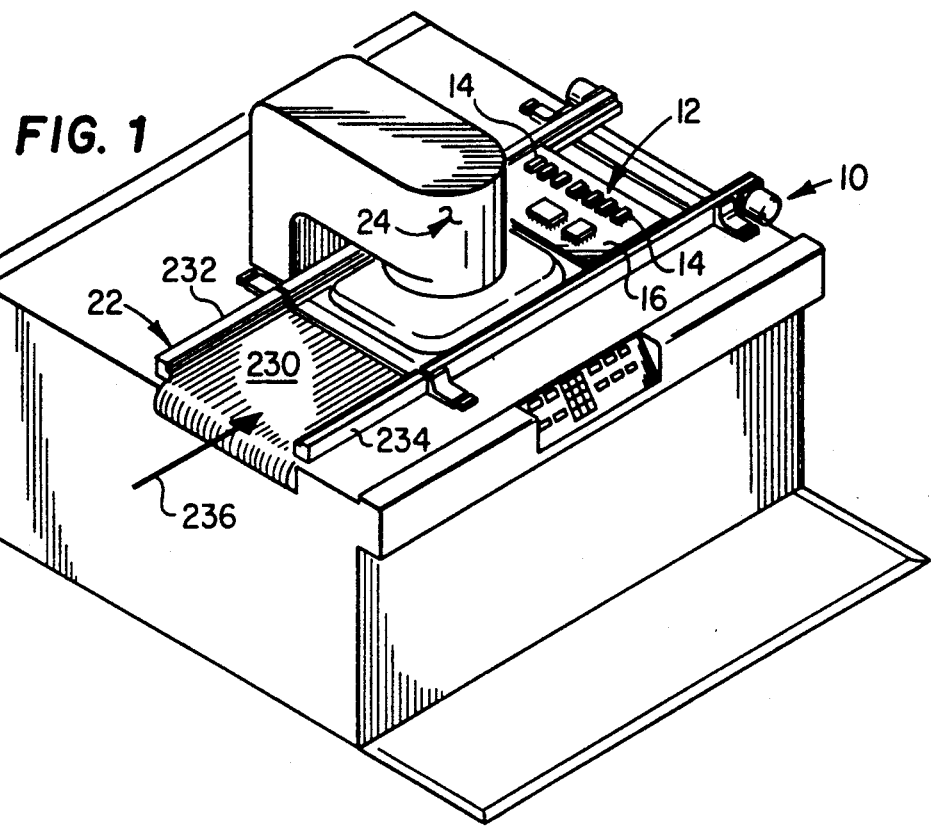
FIG. 1 is a perspective view of a circuit board cleaning apparatus forming a first embodiment of the present invention.
Figure 3:
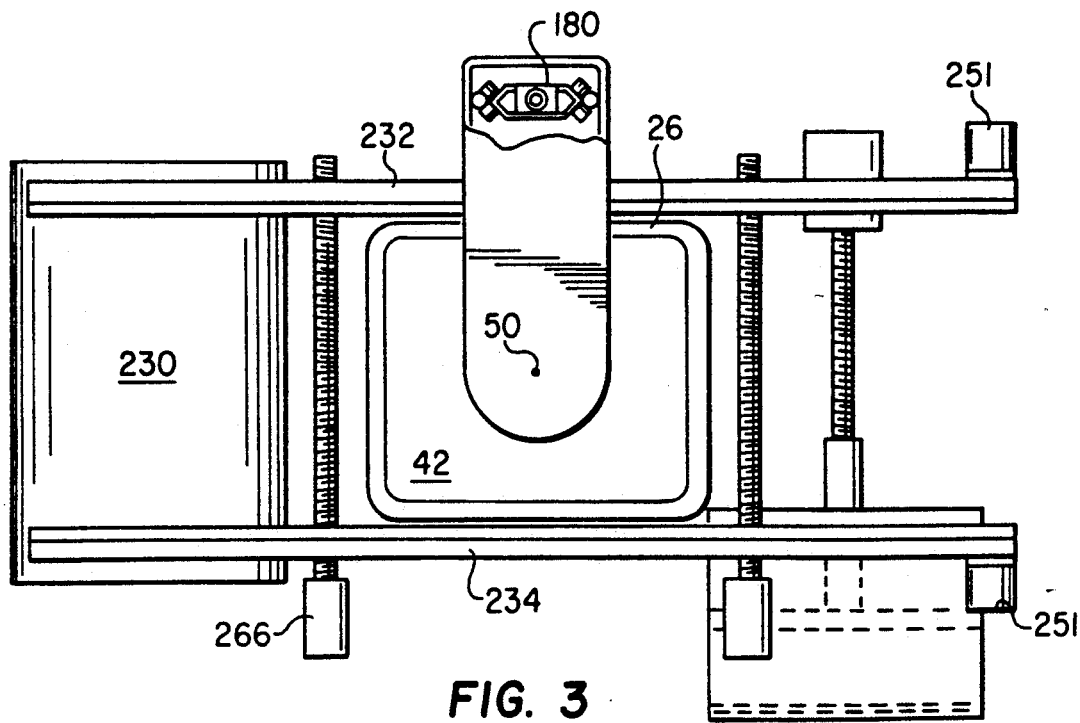
FIG. 3 is an illustrative plan view of the apparatus.

Referring now to FIG. 1, a circuit board cleaning apparatus 10 is illustrated which forms a first embodiment of the present invention. As will be described in greater detailed hereinafter, the apparatus 10 will clean a circuit board 12 after the various electronic components 14 have been soldered to the board. Typically, the components are mounted on the upper surface 16 of the board with individual contacts or leads from the components extending through the board and lower surface 18 (see FIG. 10) of the board where they are soldered to the various ribbon like conductors 20 on the board itself. The board 12 described and illustrated uses through hole technology. The present invention can be as readily used with boards using surface mount technology.

The apparatus 10 will orient the circuit board to be cleaned with conveyor assembly 22, and position the board beneath a grasping and oscillating head assembly 24. The head assembly 24 will grasp the circuit board and lower the board into a tank 26 defining an enclosed chamber 28. The circuit board is immersed in water, freon, trichloroethane or other suitable liquid cleaning agent and oscillated therein to clean the board. The board is subsequently rinsed and dried, all within the chamber 28. The head assembly reorients the clean board and removes it from the tank for conveyance from the apparatus.

Figure 2:
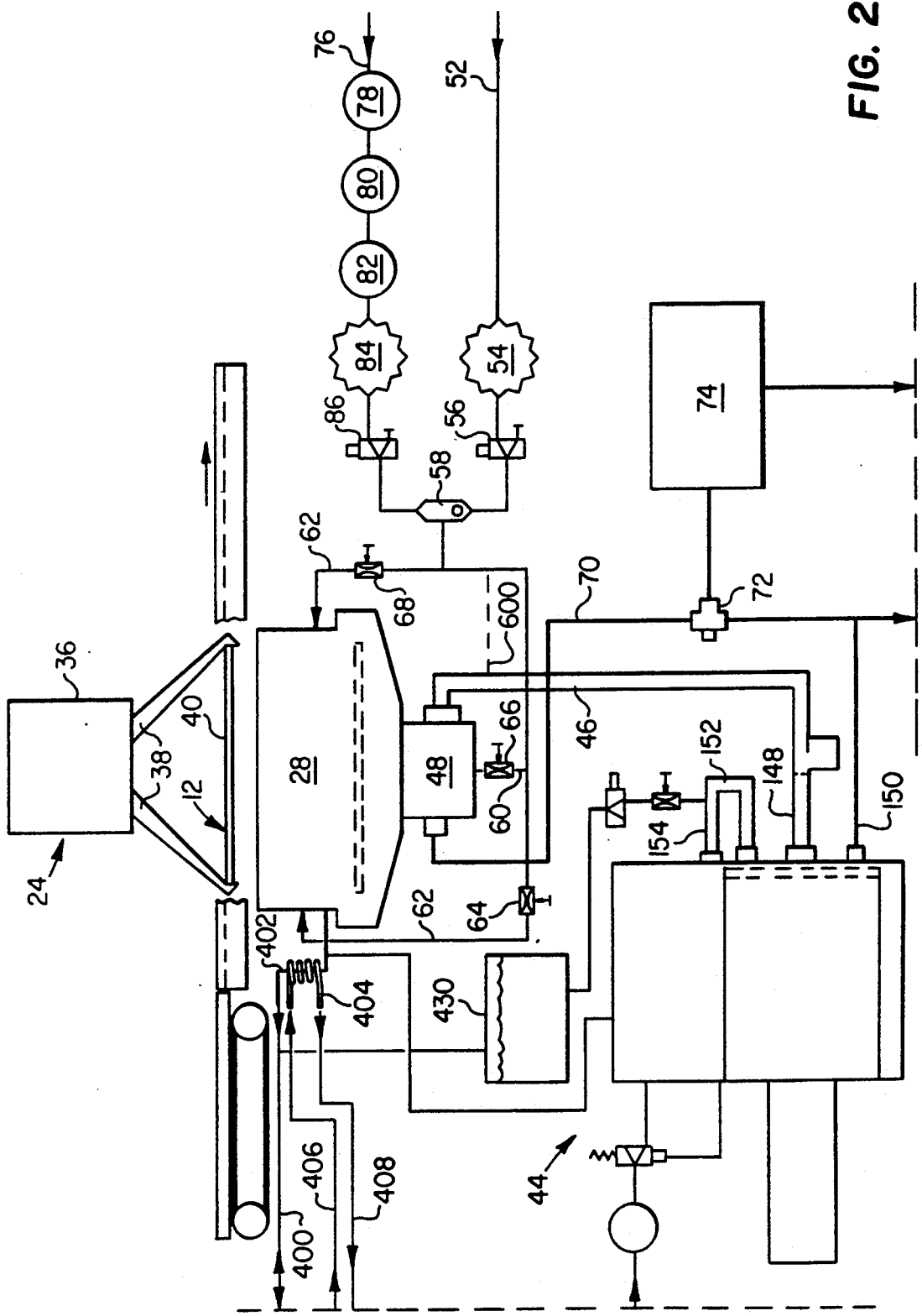
FIG. 2 is a schematic of the operation of the circuit cleaning apparatus.
Figure 4:
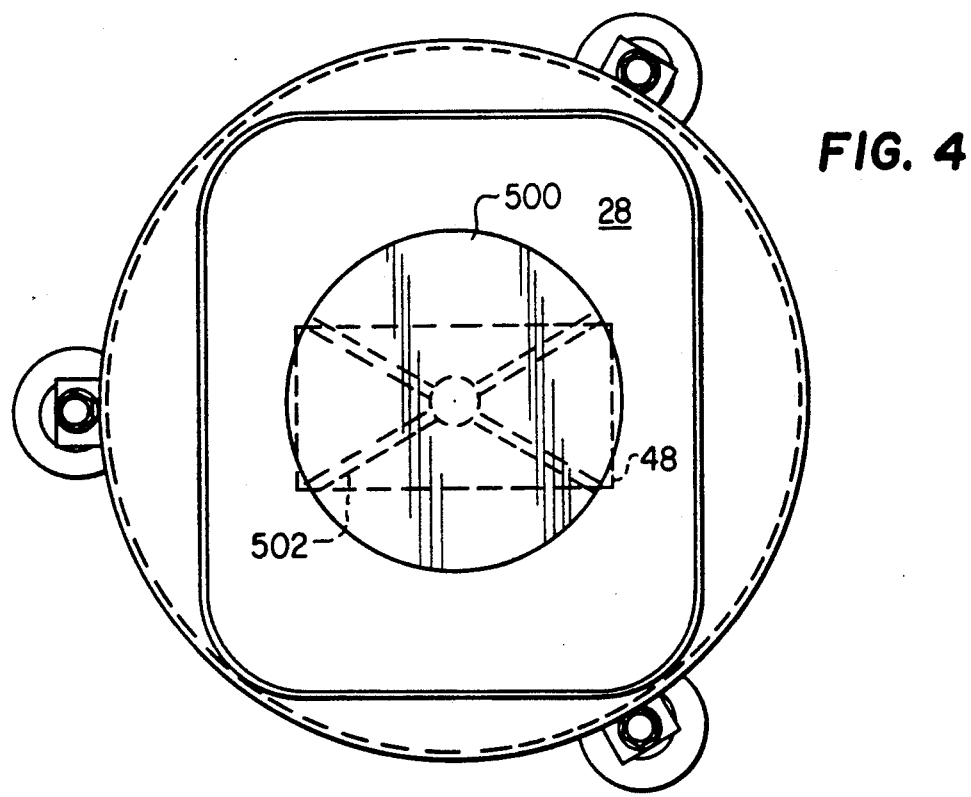
FIG. 4 is a plan view of the chamber in which the circuit board is cleaned, rinsed and dried.

With reference now to FIG. 2, a general schematic of the apparatus is illustrated The circuit board to be cleaned is conveyed toward the device on a belt conveyor 230. As it approaches the head assembly 24, cooperating rails 232 and 234 deskew the board and align the board with the direction of motion of the conveyor. As the board approaches the end of belt conveyor 230, edge conveyors on the rails 230 and 232, formed by moving drive belts 244 and 246, move the board further along the apparatus. When the board moves under the head assembly 24, belts 244 and 246 stop and the head 36 will be lowered and arms 38 operated to grasp the circuit board by its edges 40.

After the board has been grasped by arms 38, the head 36 continues its downward motion to position the board within the chamber 28. A cover 42 forms a part of the head 36 which engages the upper edge of the tank 26 to form a sealed enclosed chamber 28 when the board is properly positioned within the chamber.

Water, or other suitable liquid cleaning agent to clean the board, is supplied to the tank from a pump assembly 44. The pump assembly is capable of supplying a large quantity of cleaning agent for cleaning very rapidly through the supply line 46 to the tank 26 through the valve block 48 mounted on the tank. An additive tank 430 can supply a quantity of suitable additive such as a saponifier to the cleaning agent. When the board has been immersed in cleaning agent, the head 36 oscillates the board about the vertical axis 196 to generate vigorous relative motion between the cleaning agent and the board to thoroughly wash the board. While the board can be rotated in one axial direction about the axis rather than oscillated in both directions, a vortex formed in the cleaning agent through the spinning motion of the board might provide less effective cleaning action than the oscillation in both rotational directions. When the board has been cleaned, the pump assembly 44 rapidly draws all cleaning agent from the tank, leaving the tank empty.

The board is then sprayed with deionized rinsing water, tap water, alcohol based solvent or other suitable rinsing agent through a supply line 52 at a relatively high pressure. By spinning the board about vertical axis 196 as the rinsing agent is sprayed onto it, the rinsing action of the agent is greatly enhanced. The rinse agent can be heated by water heater 54 prior to entering the tank to increase its efficacy. The flow of rinsing agent is controlled by a solenoid operated valve 56 which, when open, permits the rinsing agent to flow through two-way check valve 58 to the tank through a lower spray circuit 60 and an upper spray circuit 62.

The lower spray circuit 60 passes through the valve block 48 and ends in a nozzle directed toward the lower surface 18 of the board 12. The upper spray circuit 62 includes multiple nozzles distributed circumferentially around the inner wall of the tank and directed toward the upper surface 16 of the circuit board 12. Thus, when solenoid valve 56 is open, the pressurized rinsing agent will be sprayed simultaneously on both surfaces of the board for effective rinsing. Individual valves 64, 66 and 68 can provide for adjustment of the relative nozzle pressures, or to shut off selected nozzles to tailor the rinsing cycle to a particular board configuration.

After rinsing, the rinse agent drains to the bottom of the tank 26. The valve block 48 is operated to drain the rinse agent from the tank through a drain line 70. Along the drain line 70 is a tee connection 72. One branch of the tee connection extends to a resistivity measurement sensor 74 which provides instantaneous measurement of the resistivity of the rinse agent after rinsing the circuit board. Detection of an abnormal resistivity would indicate the board was not sufficiently cleaned during the initial cleaning process. This information would allow the operator to reclean the board to a minimum standard. It also permits the operator to adjust the conditions of the cleaning for subsequent boards. The other connection from the tee is to a drain or recycling apparatus for deionizing and decontaminating the rinse water for reuse, if desired.

While it is preferred to immerse the circuit board in liquid cleaning agent and oscillate the board, alternatively it is also possible to spray the cleaning agent onto the board while spinning the board instead. With such an alternative design, the liquid cleaning agent can be sprayed onto the board through spray circuits 60 and 62 by connecting the pump assembly 44 to those circuits by a line 600 as illustrated in FIG. 2 in dotted line. Also, while it is preferred to spray rinsing agent on the circuit board while spinning the board, the board can alternatively be immersed in rinsing agent and oscillated therein for rinsing. This could be accomplished in the design of apparatus 10 by closing valve block 48 off from the drain as the rinsing agent sprays into the chamber to immerse the board, and subsequently oscillating the board.

The interaction of spraying a liquid agent onto a circuit board while spinning the board about a vertical axis, and measuring the resistivity of the agent after interacting with the board, forms the basis for an effective apparatus intended solely to measure the cleanliness of a circuit board, apart from any cleaning or rinsing action. Conventional circuit board cleanliness sensing devices require forty-five minutes to sense the cleanliness of a single board. By spinning the board while spraying agent on it, or if preferred, immersing the circuit board in the liquid agent and subsequently oscillating or rotating the board within the liquid agent, any contaminants on the board are quickly transferred to the agent and the presence of the contaminants detected by the change in resistivity of the agent to measure the cleanliness in a short interval, perhaps fifteen seconds. Apparatus 10 can be used therefore solely as a circuit board cleanliness measuring device. As such, the pump assembly 44 and related washing equipment becomes superfluous, and can be eliminated.

After a rinse, the circuit board is then dried with high pressure air in supply line 76. The air pressure is regulated by regulator 78 and filtered by filter 80. A dryer 82 will dry the air for more effective moisture removal from the board and a heater 84 can be employed to heat the air for even greater enhancement of the moisture removal. A solenoid valve 86 controls delivery of the air to the tank. Opening of the valve causes the air to flow through the two-way check valve 58 and through the spray circuits 60 and 62 to impact upon the board and dry the board.

The tank 26 is vented by line 400, which includes a vertical portion 402. A water cooled coil 404 is wrapped about portion 402 and forms part of a water flow circuit including inlet line 406 and outlet line 408. By cooling the hot vented air at portion 402, vaporized cleaning agent and vaporized rinsing agent condenses out of the air flow and drains along a drain line from vent line 400 to the pump reservoir which reduces the emission of any hazardous agent from the apparatus.

When the board has dried, the solenoid 86 closes, blocking the air supply. The head 36 then lifts the board from the tank into the plane of the conveyor assembly. The rails 32 and 34 are moved together to again support the board, and arms 38 are disengaged from the board. The edge conveyor on each rail formed by moving drive belts 244 and 246 is then employed to move the cleaned board out of the apparatus.

Figure 5:
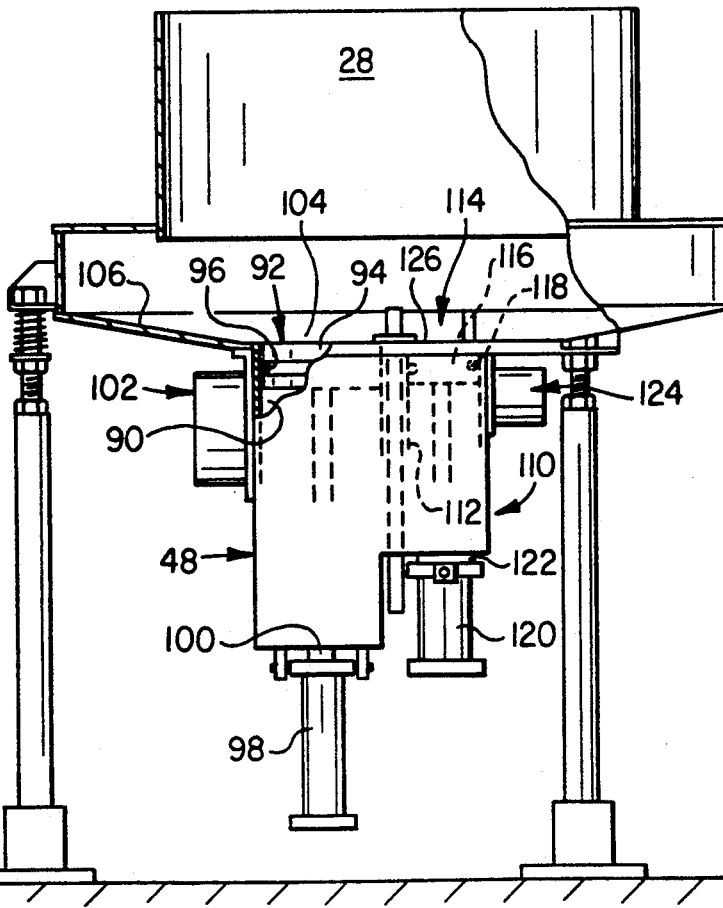
FIG. 5 is a side view of the tank illustrating the valve operation.

With reference now to FIGS. 5-8, as well as FIG. 2, further details of the pump assembly 44 and valve block 48 will be described. FIG. 5 best illustrates the valve block 48 which is mounted on the bottom of the tank 26. Valve block 48 incorporates a first cylinder 90 which opens through an aperture 92 in the bottom of the tank into the chamber 28. A piston 94 sealingly engages the wall of the cylinder 90 through an O-ring seal 96 and can be moved vertically within the cylinder by a double acting air cylinder 98 connected to the piston through piston rod 100. A relatively large diameter passage 102 opens through the valve block and into the cylinder 90 spaced a distance below the aperture 92.

In operation, the passage 102 is connected to the supply line 46. When the cleaning fluid is to be provided to the tank, the air cylinder 98 is activated to lower the piston 94 to a valve opened position, connecting the passage 102 to the chamber 28 through aperture 92 to allow the cleaning fluid to enter the tank. A baffle plate 500, with reinforcing dimples 502, is mounted in the tank between aperture 92 and the board to prevent the force of the cleaning fluid entering the tank from impacting directly on the board. After cleaning, the fluid is withdrawn from the tank through the passage 102 and the air cylinder 98 is activated to move the piston 94 to the valve closed position where the upper surface 104 of the piston 94 is flush with the bottom surface 106 of the tank to prevent any moisture from collecting at the bottom of the tank.

A drain valve 110 is formed in another portion of the valve block 48. The function of valve 110 is to drain the rinse agent from the tank during the rinsing cycle. Valve 110 includes a cylinder 112 defined in the valve block which opens into the tank through an aperture 114 in the wall of the tank. A piston 116 is slidably sealed to the wall of the cylinder by seal 118. An air cylinder 120 moves the piston vertically within the cylinder through the piston rod 122. A passage 124 opens through the side of the valve block and into the cylinder 112 spaced somewhat below the aperture 114. When the rinse agent is to be drained, the air cylinder 120 is operated to move the piston downwardly below the passage 124,, permitting the rinse agent to flow from the tank, through the passage 124 and to the drain line 70. When completely drained, the air cylinder is again activated to move the piston 116 upwardly to the valve closed position isolating the passage 124 from the tank. The upper surface 126, of the piston is formed to lie flush with the bottom surface 106 of the tank as well to avoid fluid trappage.

Figure 7:
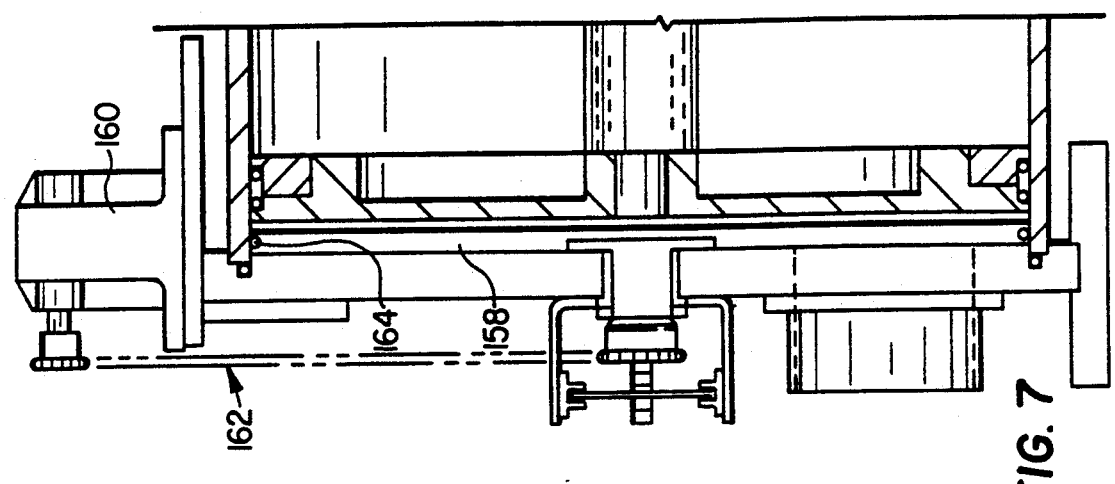
FIG. 7 is a partial cross sectional view of the details of the pump of FIG. 6.
Figure 8:
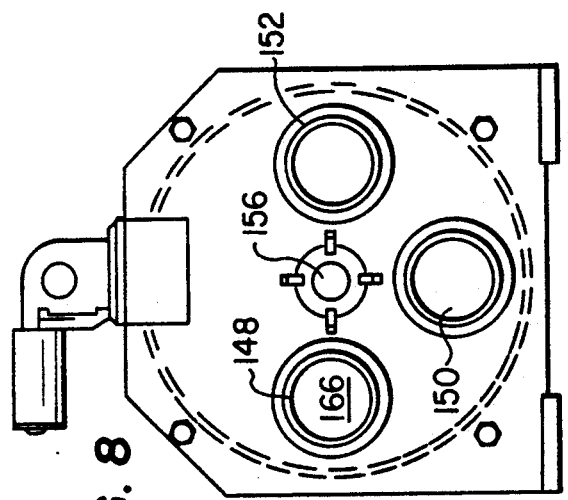
FIG. 8 is a vertical cross sectional view of the valve disc used in the pump of FIG. 6.
Figure 6:
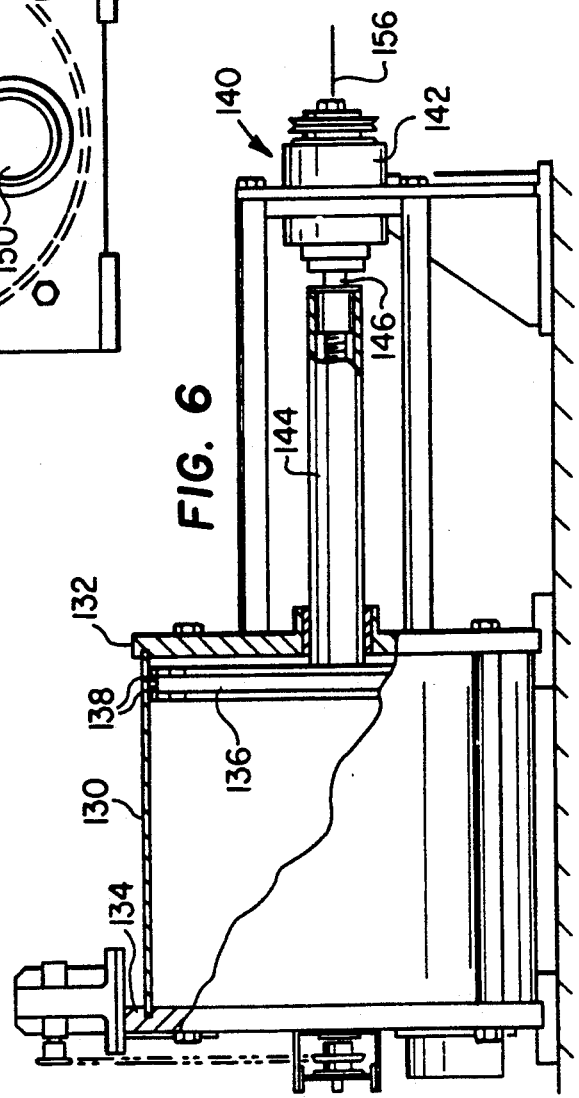
FIG. 6 is a side view of the fast discharge pump providing water to the tank for cleaning.

With references now to FIGS. 6-8, the operation of the pump assembly will be described. As best seen in FIG. 6, the pump assembly includes a cylinder 130 mounted between a first end plate 132 and a second end plate 134. Within the cylinder is a piston 136 which is sealed to the inner wall of the cylinder by O-ring seals 138.

The piston is movable within the cylinder by a drive assembly 140 comprising a reversible motor 142, a threaded sleeve 144 and a threaded rod 146. The threaded sleeve 144 is secured to the piston 136 and passes through the end plate 132. The threaded rod 146 is secured to the drive shaft of the reversible motor and threadedly engages the sleeve 144. As the motor 142 is operated in one direction, the sleeve causes the rod and piston to move rapidly to the left, as seen in FIG. 6, to perform a pumping stroke. By reversing the motor, the rod drives the sleeve and piston to retract, toward the right in FIG. 6, to perform a suction stroke. As best seen in FIG. 8, several fluid connections are made through the end plate 134. For example, connection 148 forms part of the supply line 46 directed to the valve block 48. Connector 150 connects to drain line 75. Finally, connector 152 connects to a reservoir line 154. As can be observed from FIG. 8, each of the connectors are centered at the same radial distance from the center line 156 of the cylinder 130 and angularly spaced about the axis from each other.

A manifold disc 158 is mounted on the end plate 134 for rotation about the center line 156 by a motor 160 and drive train 162. The outer periphery of the disc 158 is sealed to the inner wall of the cylinder by an O-ring seal 164 to prevent fluid flow about the edge of the disc. A single aperture 166 is formed through the disc which is centered on the same radius as connectors 148, 150 and 152 from the center line 156. By rotating the disc 158 with motor 160, the aperture 166 can be selectively positioned before each of the connectors to connect the piston chamber to the supply line, the drain, or the valve block 48.

Figure 9:
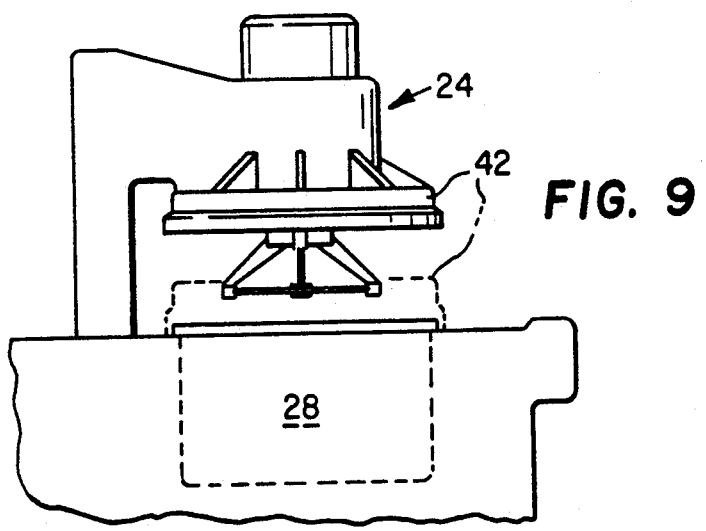
FIG. 9 is a side view of the circuit board cleaning apparatus illustrating the oscillation head assembly holding a circuit board.

FIGS. 9-13 illustrate details of the head assembly 24. With reference to FIG. 9, the head assembly includes head 36 supporting a pivotal drive shaft 183 for pivotal rotation and oscillation about vertical axis 196. Drive shaft 183 mounts four arms 38 to grasp the circuit board to be cleaned. The entire head assembly is moved downward on bearing structure 180 to move the circuit board into the tank 26 for cleaning. The positioning of the circuit board at the desired point within the tank corresponds to the cover 42 sealing the tank 26 to create a self-contained environment.

Figure 10:
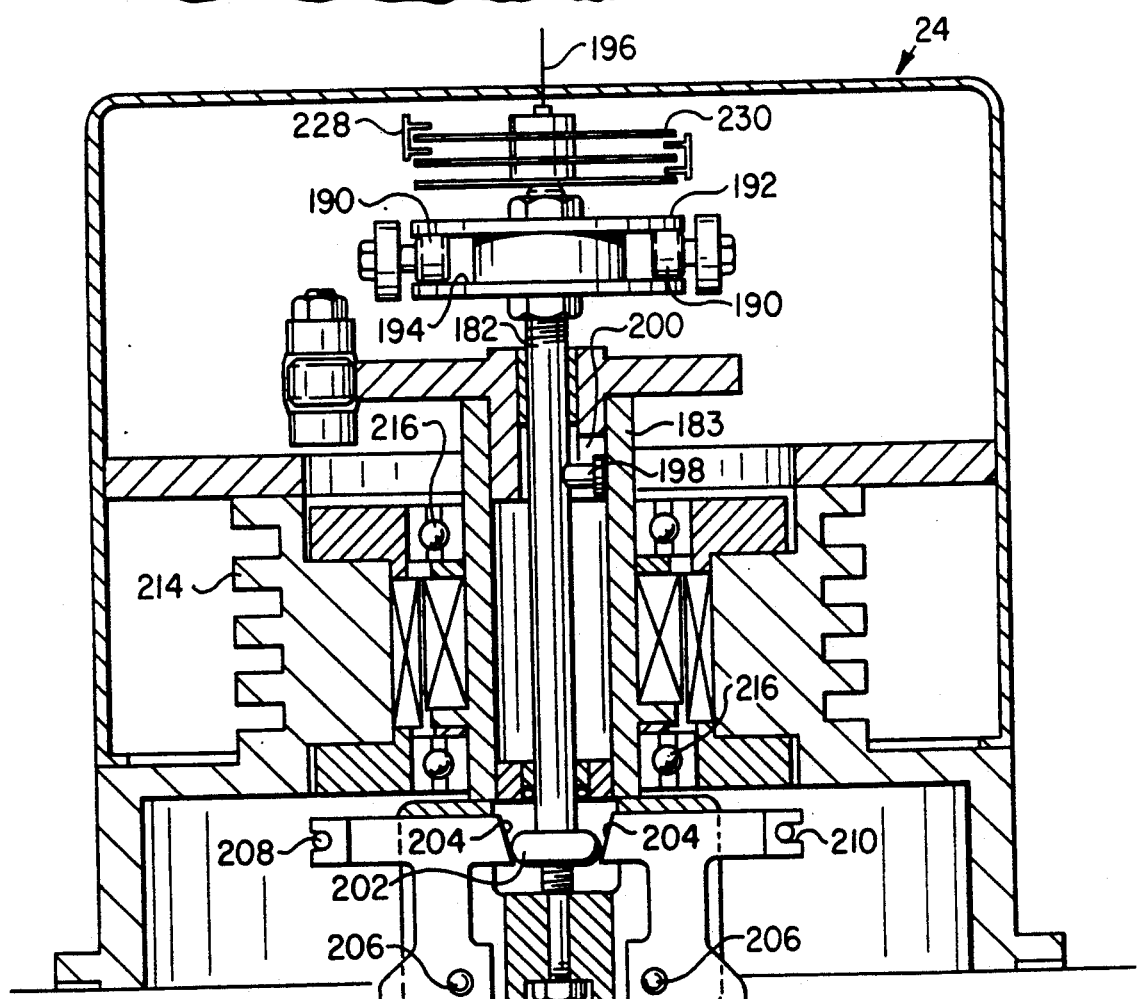
FIG. 10 is a vertical cross sectional view of the head assembly.
Figure 11:
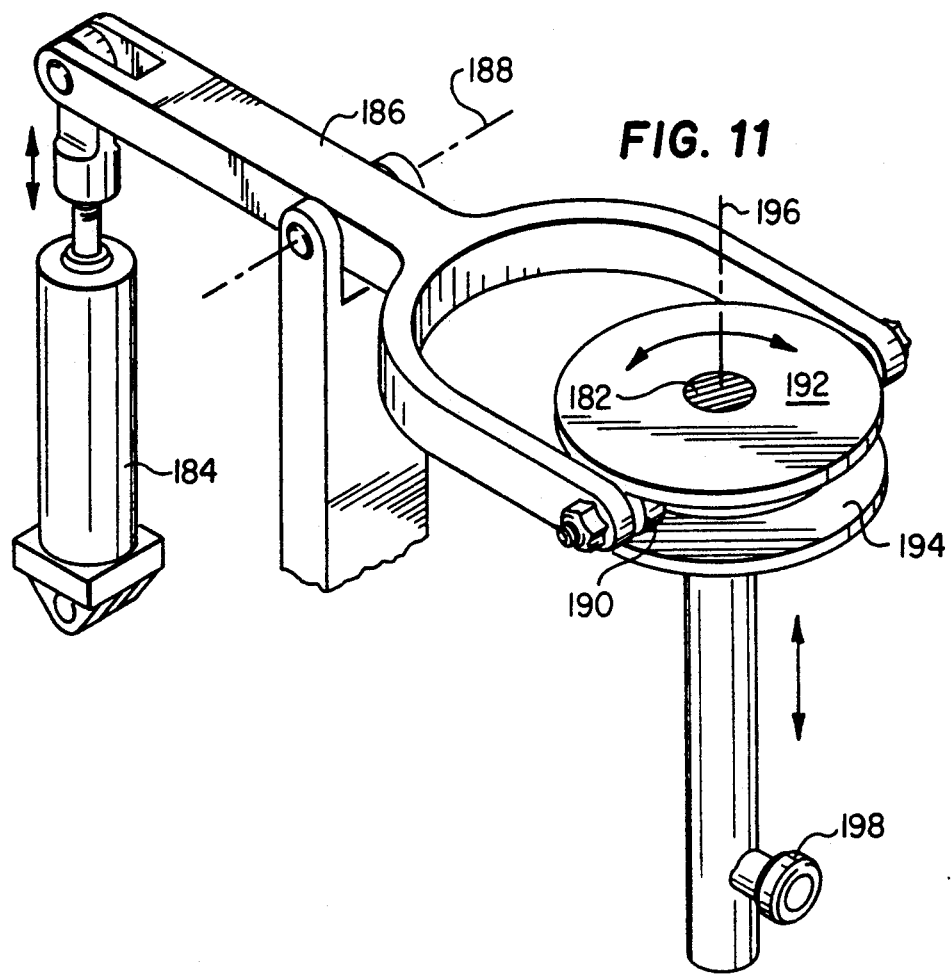
FIG. 11 is a perspective view of the mechanism for operating the arms to grasp the board.

With reference now to FIGS. 10 and 11, further details of the head will be described. The drive shaft 183 includes a central vertical shaft 182 which pivots the arms 38 between a release position, and a position grasping the circuit board. This vertical motion is induced by a double-acting air cylinder 184 acting through a fork 186 pivoted at axis 188 to the head structure. The forked ends of the fork 186 mount rotating bearing cylinders 190 which run within groove 194 of a pulley 192. The pulley 192 is fixed to the shaft 182, and movement of the fork thus induces vertical motion in the shaft 182. However, by use of the cylinders 190 and groove 194, the shafts 182 and 183 can rotate about the vertical axis 196 relative to the fork 186.

A threaded stop 198 is mounted along the shaft 182 for movement within a slot 200 formed within the shaft 183. The slot limits the extent of vertical motion of the shaft 182 and therefore the degree of pivotal motion of arms 38.

At the lower end of the shaft is mounted a camming ring 202. The camming ring 202 engages tapered surfaces 204 on each of the arms 38. The arms are pivoted about pins 206 mounted on shaft 183 and are urged to the release position by a cylindrical spring 208 extending around the upper portions of each arm and in a notch 210 in each arm.

The lower end of each arm actually moves into contact with the board. The lower end of each arm includes a V-shaped notch 212 which is designed to contact the board only at the outer edge of the lower and upper surfaces to minimize the contact area between the arms and board and maximize the surface area of the board exposed to cleaning.

A motor 214, including bearings 216, in the head oscillates the shafts 182 and 183 about the vertical axis 196 and, as a consequence, rotates the circuit board held by the arms 38. The motor 214 is preferably controllable to oscillate the shaft about the vertical axis, or rotate the shaft as desired. The frequency of oscillation is preferably variable as is the degree of angular travel in each direction before reversing.

Figure 12:
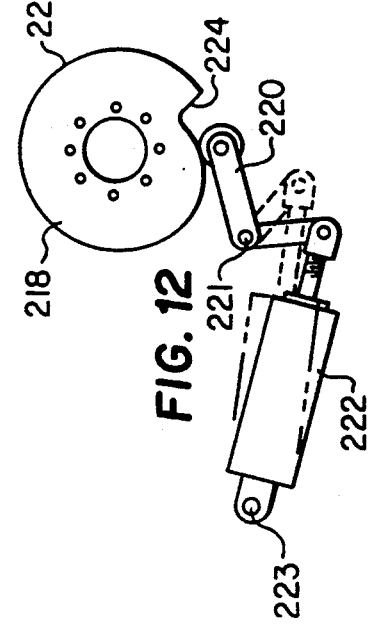
FIG. 12 is a plan view of the positioning cam mechanism orienting the circuit board after cleaning.

With reference to FIGS. 10 and 12, there is illustrated an orienting cam 218 and an orienting arm 220 which assures that the circuit board will begin and end its oscillating motion at the same angular relation to the apparatus 10. Arm 220 is pivoted to the head at 221. An air cylinder 222 is pivotally mounted to the head at 223. As the board is grasped, the double-acting air cylinder 222 has pivoted the arm 220 against the stop surface 224 on the cam 218. After the board has been grasped and lowered into the tank for cleaning, the air cylinder 222 is activated to move the arm away from the cam 218. This permits free rotation of the shafts 182 and 183 in whatever predetermined sequence is desired for proper cleaning, rinsing and drying. When cleaning of the board has been completed, the cylinder 222 is again activated to move the arm into contact with the camming surface 226 of the cam, wherever the cam may be located relative to the arm. The motor will continue to operate to pivot the shafts 182 and 183 until the arm again contacts the stop surface 224. This resistance to motion will be sensed in the motor control and the motor will stop, positioning the cleaned circuit board in the exact orientation it was as it began the cleaning cycle.

Various motion sensors 228 can be mounted in cooperation with timing discs 230 on the shaft 182, as seen in FIG. 10, to provide for various control functions in the head.

Figure 13A:
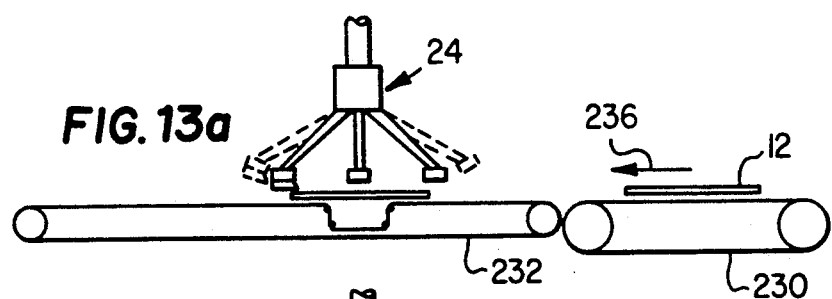
FIGS. 13A-D illustrate the sequence of grasping a circuit board, immersing the circuit board in the chamber for cleaning, rinsing and drying, and release of the circuit board.
Figure 13B:
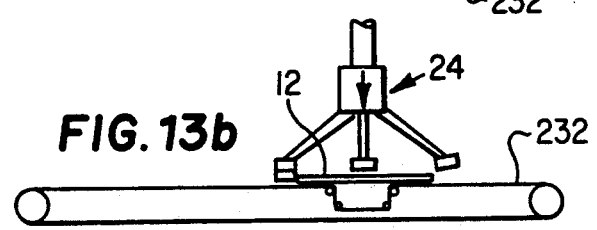
Figure 13C:
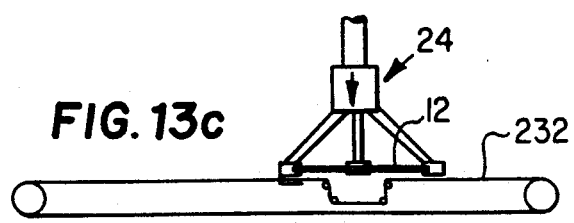
Figure 13D:
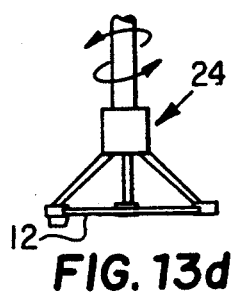

FIGS. 13A-D illustrate schematically the operation of the head assembly. In FIG. 13A, the circuit board has been positioned below the head assembly for cleaning. In FIG. 13B, the head has been lowered along bearing structure 180 to position the arms next to the edges of the circuit board. FIG. 13C illustrates the movement of the arms inward to grasp the circuit board upon activation of air cylinder 184. Finally, FIG. 13D illustrates the movement of the circuit board into the tank along bearing structure 180 and the subsequent oscillation of the board by the motor 214 during the washing, rinsing and drying steps.

Figure 15:
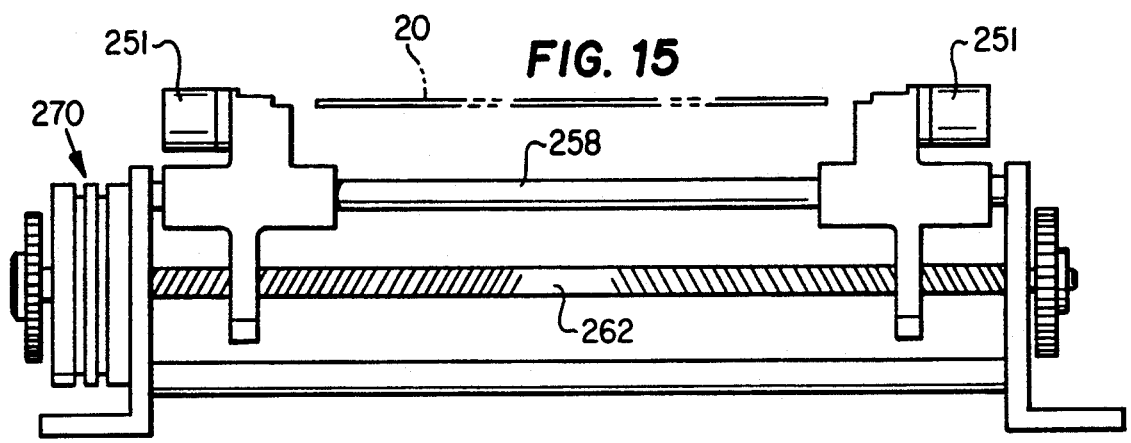
FIG. 15 is an end view of the conveyor assembly.
Figure 16:
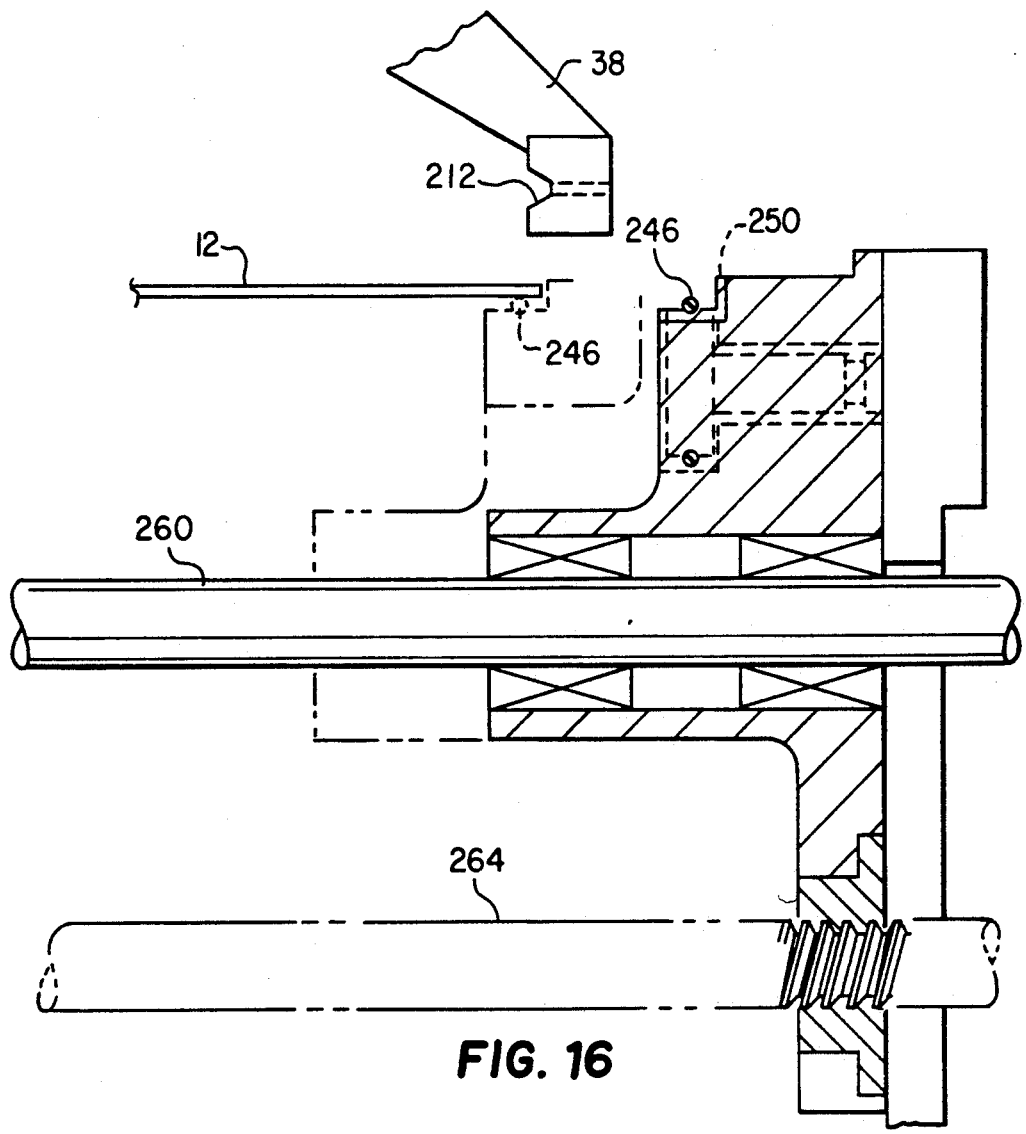
FIG. 16 is a vertical cross sectional view of a portion of the conveyor assembly.

With reference now to FIGS. 14–16, the details of the conveyor assembly 22 are illustrated. Included in the assembly is the conveyor belt 230 and centering rails 232 and 234. The rails 232 and 234 extend the entire width of the apparatus, as best seen in FIG. 1, while the conveyor belt 230 only extends from one side of the apparatus to approximately the head assembly 24.

The boards to be cleaned will be placed on the conveyor belt 230 by any suitable method or apparatus. The belt 230 will move the board in the direction of arrow 236 toward the head assembly. The board may well be skewed relative to the arrow 236 and must be aligned to be properly grasped by the arms 38 for cleaning. This deskewing or alignment is performed by the centering rails 232 and 234 and associated operating mechanism. Essentially, the center rails 232 and 234 move toward each other toward the center line 238 of the apparatus, with the side walls 240 and 242 thereof contacting the board to pivot it into alignment with the center line and center the board. When the board has been deskewed and centered, and further inward movement of the rails would damage the board, the inward movement of the rails is stopped. Preferably, a sensor 506 is mounted on one of the centering rails to sense motion of the rails near one of the arms 38 used to grasp the sides of the boards to signal stoppage of the inward movement of the rails in deskewing the board. However, other sensing techniques can be employed. The conveyor belt 230 continues to move the board, now aligned along the center line 238, to a position where the belts 244 and 246 contact the board to move the board directly under the head assembly 24 to be grasped by the arms 38.

The upper path of each belt contacts the bottom edges of the board on opposite sides of the centerline 238. The belts 244 and 246 are continuous flexible belts, preferably O-rings, which are mounted for rotation on each rail between a drive wheel 248 and an idler wheel 250 on each rail. The drive wheel 248 for each belt is driven by an AC syncronous motor 251 such as manufactured by Bodine Company. As best seen in FIG. 14, a set of rollers 252 divert the upper path of the drive belts to open up a notch 254 in each rail to allow an arm 38 to move around the edge of the board when the board is positioned directly under the head assembly 24.

The drive belts will cease their motion when a board to be cleaned is positioned directly under the head assembly, permitting the board to be grasped by the arms 38. The belts stop their motion so as to impart just enough momentum to the board to bump gently against a stop 504 extending downward from the second arm 38 on centerline 238 along the direction of arrow 238 to exactly position the board for grasping by the arms. After the board is grasped, the rails move outward from centerline 238, away from the board, providing clearance for the board and head to move down into the tank 26 for processing. When the processing is complete, the head and board are again lifted up to the entry level, and the center rails 232 and 234 brought inward again toward the center line 238 so that the bottom edges of the board again rest on the drive belts 244 and 246. Again, inward motion of the rails is controlled by sensor 506 moving proximate an arm 38 on the side of the board. The arms 38 release the board and the head moves vertically upward out of the way of the board. The motors 251 can then be reactivated to drive the belts 244 and 246 and the board supported thereon further in the direction of arrow 236 to be removed from the apparatus as a cleaned circuit board.

The center rails 232 and 234 move along guide rods 258 and 260 mounted within the apparatus, with the rods extending perpendicular the center line 238. This ensures that all motion of the rails is along the guide rods toward or away from the center line. Reverse threaded drive screws 262 and 264 extend through threaded apertures at each end of the centering rails and are rotated by a DC stepping motor or torque motor 266 directly connected to screw 262, and through a drive belt and pulley assembly 268 to screw 264, so that rotation of the motor shaft will move the rails inward or outward from the center line as desired. As noted previously, the inward motion of the rails is halted by a sensor on one of the rails sensing movement proximate one of the arms 38 on the side of centerline 238. If motor 266 is a torque motor, the motor can be designed to stall when the rails have moved inwardly sufficiently so that the sidewalls thereof both are in contact with the edges of the circuit board to act as a fail safe backup to the arm proximity sensor or as the primary rail stopping control. If other motor designs are employed, a digital optical encoder 270 which accurately counts the rotation of screw 262 can be used to guide the rail motion as either a backup control or primary control.

In one device constructed in accordance with the teachings of the present invention, the notches in the arms of the head assembly are one-half inch above the board as it moves into position for grasping. The head assembly is then lowered one-half inch to position the notches beside the edges of the board and the arms are activated to grasp the board. After being grasped, the board and head assembly move 9 ½ inches downward into the tank to position the bottom surface of the board about one inch off the bottom of the tank.

The pump assembly is operated to supply about 6 ½ gallons of water, or other suitable cleaning solvent, to the tank in a time period of about one to two seconds. The board is then oscillated about the vertical axis at a vigorous rate for perhaps five to eight seconds.

The cleaning water or solvent is evacuated by the pump assembly completely within two to three seconds. The board then begins a continuous spinning motion with rinsing water dispensed from the various nozzles to impact both upper and lower surfaces of the board. After the rinsing is complete, the hot dry air is blown over the board to dry the board. A complete cycle for board cleaning, including cleaning, rinsing and drying, is believed to take about thirty seconds.

The piston assembly of the device has a piston sixteen inches in diameter with a stroke length of about twelve inches. The motor and screw moving the piston is designed to move the piston this twelve inch distance in about one second. The inner diameter of the supply line from the pump assembly to the tank is about four inches, as is the diameter of the passage and cylinder through the valve block opening into the tank, to reduce flow resistance as much as possible. The inner diameter of the drain line for the rinse water is about two inches, as is the passage and cylinder connected thereto in the valve block to again minimize flow resistance to drain the rinse water from the tank. The rinse water is preferably heated to a temperature of about 150° F. The drying air is provided at about a rate of 600 cu.ft. per minute.

While one embodiment of the present invention has been illustrated in the accompanying drawings and described in the foregoing Detailed Description, it will be understood that the invention is not limited to the embodiment disclosed, but is capable of numerous rearrangements, modifications and substitutions of parts and elements without departing from the spirit of the invention.

We claim:

1. A method for cleaning a circuit board, comprising the steps of:

exposing the circuit board to a liquid cleaning agent;

moving the circuit board within the liquid cleaning agent to induce relative motion between the liquid cleaning agent and the circuit board to clean the circuit board, said circuit board having a circuit board plane coinciding with the major dimensions of the board, the direction of movement of the circuit board within the liquid cleaning agent lying substantially within the circuit board plane; and separating the cleaned circuit board and liquid cleaning agent.

2. The method of claim 1 wherein said step of moving the circuit board includes means for spinning the circuit board.

3. The method of claim 2 wherein said step of exposing the circuit board to the liquid cleaning agent includes the step of spraying the liquid cleaning agent onto the board.

4. The method of claim 1 wherein said step of moving the circuit board includes means for oscillating the board about an axis.

5. The method of claim 4 wherein said step of exposing the circuit board to the liquid cleaning agent includes the step of immersing the board in the liquid cleaning agent.

6. The method of claim 1 further comprising the steps of:

exposing the circuit board to a rinsing cleaning agent; and moving the circuit board within liquid cleaning agent; and the direction of movement of the circuit board being substantially coplanar with the plane of the circuit board to rinse the circuit board; and separating the rinsed circuit board and liquid rinsing agent.

7. The method of claim 6 further comprising the steps of:

exposing the circuit board to a drying agent.

8. The method of claim 2 wherein the step of spinning the circuit board includes the step of spinning the circuit about an axis, centrifugal and coriolis energies generated by the spinning of the circuit board within the liquid cleaning agent causing the liquid cleaning agent to penetrate under components, connectors and mounted items to remove flux from the circuit board.

9. The method of claim 7 wherein the washing, rinsing and drying steps are performed within a single process chamber without removing the circuit board from said means for moving the circuit board.

10. The method of claim 2 further comprising the step of exposing a second circuit board to the liquid cleaning agent and spinning the second circuit board about the same axis as the circuit board, the second circuit board being spaced along the axis from the circuit board.

* * * * *

UNITED STATES PATENT AND TRADEMARK OFFICE
CERTIFICATE OF CORRECTION

PATENT NO. : 5,030,293

DATED : July 9, 1991

INVENTOR(S) : Randall L. Rich et al.

It is certified that error appears in the above-identified patent and that said Letters Patent is hereby corrected as shown below:

In the Abstract, line 3, delete "whre" and insert --where--.

Column 4, line 38, after "illustrated", insert --.--.

Column 7, line 23, delete "126," and insert --126--.

Signed and Sealed this

Twenty-eighth Day of September, 1993

Attest:

BRUCE LEHMAN

Attesting Officer

Commissioner of Patents and Trademarks